(12) United States Patent
Chin et al.

(10) Patent No.: US 10,263,405 B2
(45) Date of Patent: Apr. 16, 2019

(54) CIRCUIT ASSEMBLY AND ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Tou Chin, Mie (JP); Arinobu Nakamura, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 15/763,513

(22) PCT Filed: Sep. 9, 2016

(86) PCT No.: PCT/JP2016/076563
§ 371 (c)(1),
(2) Date: Mar. 27, 2018

(87) PCT Pub. No.: WO2017/056915
PCT Pub. Date: Apr. 6, 2017

(65) Prior Publication Data
US 2018/0278034 A1    Sep. 27, 2018

(30) Foreign Application Priority Data
Sep. 29, 2015    (JP) .................................. 2015-190718

(51) Int. Cl.
*H02G 3/03*    (2006.01)
*H02G 3/16*    (2006.01)
(Continued)

(52) U.S. Cl.
CPC ........... *H02G 3/16* (2013.01); *B60R 16/0238* (2013.01); *H02G 3/03* (2013.01); *H05K 1/115* (2013.01);
(Continued)

(58) Field of Classification Search
CPC ...... B60R 16/0238; H05K 7/02; H05K 1/115; H05K 1/183; H05K 1/144;
(Continued)

(56) References Cited

U.S. PATENT DOCUMENTS 6,116,916 A * 9/2000 Kasai .................... H01R 9/226
361/826
6,522,528 B2 * 2/2003 Yamane ............. B60R 16/0238
361/601
(Continued)

FOREIGN PATENT DOCUMENTS

JP    2006-325352 A    11/2006
JP    2007-195289 A    8/2007
(Continued)

OTHER PUBLICATIONS

Search Report for PCT/JP2016/076563, dated Oct. 11, 2016.

*Primary Examiner* — Anatoly Vortman
(74) *Attorney, Agent, or Firm* — Honigman LLP

(57) ABSTRACT

A circuit assembly includes an electronic component including a plurality of terminals, a first board that is constituted by an insulating plate provided with a conductive path and an insertion hole into which the electronic component is inserted, a busbar that overlaps the first board, and a second board that is constituted by an insulating plate provided with a conductive path and overlapping the first board, at least a portion of the second board being arranged on the same level
(Continued)

as the busbar. The plurality of terminals of the electronic component is connected to the busbar and the conductive path of the second board.

16 Claims, 21 Drawing Sheets

(51) Int. Cl.
*H05K 7/02* (2006.01)
*B60R 16/023* (2006.01)
*H05K 1/11* (2006.01)
*H05K 1/14* (2006.01)
*H05K 1/18* (2006.01)
*H02G 3/08* (2006.01)

(52) U.S. Cl.
CPC ............ *H05K 1/144* (2013.01); *H05K 1/183* (2013.01); *H05K 7/02* (2013.01); *H02G 3/081* (2013.01); *H05K 2201/041* (2013.01); *H05K 2201/066* (2013.01); *H05K 2201/10166* (2013.01); *H05K 2201/10272* (2013.01); *H05K 2201/10409* (2013.01)

(58) Field of Classification Search
CPC .......... H05K 2201/10272; H05K 2201/10166; H05K 2201/066; H05K 2201/041; H05K 2201/10409; H02G 3/16; H02G 3/03; H02G 3/081

USPC ........................................................ 361/624
See application file for complete search history.

(56) References Cited

U.S. PATENT DOCUMENTS

| | | | | |
|---|---|---|---|---|
| 6,724,627 B2 * | 4/2004 | Onizuka | ............ | B60R 16/0238 165/185 |
| 6,873,529 B2 * | 3/2005 | Ikuta | ................. | H01L 23/5389 257/713 |
| 7,154,753 B2 * | 12/2006 | Kobayashi | ........... | H05K 1/0203 361/715 |
| 7,254,032 B1 * | 8/2007 | Xue | ................... | H01L 23/3675 257/707 |
| 7,394,659 B2 * | 7/2008 | Colgan | .................. | H01L 23/42 361/718 |
| 7,553,169 B2 * | 6/2009 | Kasai | ................... | H05K 1/0263 439/76.2 |
| 8,089,777 B2 * | 1/2012 | Negishi | ............... | H01L 23/5389 257/E21.499 |
| 10,038,315 B2 * | 7/2018 | Sumida | ................... | H02G 3/16 |
| 2003/0141105 A1 * | 7/2003 | Sugaya | ................... | H01L 21/56 174/256 |
| 2018/0079377 A1 * | 3/2018 | Maeda | ............... | B60R 16/0238 |
| 2018/0326924 A1 * | 11/2018 | Haraguchi | ............. | B60R 16/02 |

FOREIGN PATENT DOCUMENTS

| | | | | |
|---|---|---|---|---|
| JP | 2010-022117 A | | 1/2010 | |
| JP | 2016152400 A | * | 8/2016 | ............ H01L 23/36 |

* cited by examiner

CIRCUIT ASSEMBLY AND ELECTRICAL JUNCTION BOX

This application is the U.S. national stage of PCT/JP2016/076563 filed Sep. 9, 2016, which claims priority of Japanese Patent Application No. JP 2015-190718 filed Sep. 29, 2015.

TECHNICAL FIELD

This specification discloses a technology relating to a circuit assembly.

BACKGROUND

The electrical junction box disclosed in JP 2003-164039A is known as a conventional electrical junction box including a case in which a circuit assembly is accommodated. This electrical junction box is arranged between a power supply of a vehicle and in-vehicle electrical equipment such as lamps or a horn, and applies or interrupts an electric current to the in-vehicle electrical equipment. The above-mentioned circuit assembly includes a control circuit board on which a conductive pattern is formed through printed wiring, and a busbar adhered to the rear side of the control circuit board. The busbar is exposed through the opening of the control circuit board. Electronic components installed on the front surface of the control circuit board are electrically connected, by soldering or the like, to the conductive pattern on the front surface of the control circuit board and the busbar exposed through the opening.

With the above-mentioned configuration, a level difference is formed between the conductive pattern on the front surface of the control circuit board and the busbar exposed through the opening of the circuit board depending on the thicknesses of the control circuit board and an adhesive. Therefore, in order to connect the electronic components to both the conductive pattern and the busbar, it is necessary to bend the lead terminals of the electronic components in accordance with the level difference or prepare components such as relay members having a thickness corresponding to the level difference, for example. As a result, a problem arises in that the number of operation steps increases or production cost increases due to an increase in the number of components.

The present invention was accomplished based on the above-mentioned circumstances, and it is an object thereof to suppress a level difference formed between the conductive path on the board and the busbar to which the terminals of the electronic component is connected.

SUMMARY

A circuit assembly of the present invention includes an electronic component including a plurality of terminals, a first board that is constituted by an insulating plate provided with a conductive path and an insertion hole into which the electronic component is inserted, a busbar that overlaps the first board, and a second board that is constituted by an insulating plate provided with a conductive path and overlapping the first board, at least a portion of the second board being arranged on the same level as the busbar, wherein the plurality of terminals of the electronic component are connected to the busbar and the conductive path of the second board.

With this configuration, the second board overlaps the first board, and at least a portion of the second board is arranged on the same level as the busbar, thus making it less likely that a level difference is formed between the busbar and the conductive path of the second board to which the plurality of terminals of the electronic component inserted into the insertion hole of the first board are connected. Therefore, a level difference formed between the conductive path of the second board and the busbar to which the terminals of the electronic component are connected can be suppressed.

The following embodiments are preferred as embodiments of the present invention.

The busbar has a cutout portion into which the second board is press-fitted.

With this configuration, the second board can be positioned with respect to the busbar.

The conductive path of the first board is electrically connected to a relay portion passing through the first board, and the relay portion is connected to the conductive path of the second board with solder.

With this configuration, the terminals of the electronic component can be electrically connected to the conductive path of the first board via the conductive path of the second board and the relay portion.

The electronic component is sheathed by a sheathing body made of a resin, and the terminals are exposed through the sheathing body and lined up along a bottom surface of the sheathing body.

With this configuration, the size of the electronic component can be reduced, and therefore, the size of the circuit assembly can be reduced.

The insertion hole is a through hole, and the electronic component is accommodated entirely in the insertion hole.

With this configuration, it is possible to prevent the electronic component from protruding from the surface of the first board, thus making it possible to reduce the size of the circuit assembly.

Another aspect of the present invention is an electrical junction box including the above-mentioned circuit assembly and a case in which the circuit assembly is accommodated.

Advantageous Effects of Invention

With the present invention, a level difference formed between a conductive path of a board and a busbar to which terminals of the electronic component are connected can be suppressed.

DETAILED DESCRIPTION OF PREFERRED EMBODIMENTS

Embodiment 1

Embodiment 1 will be described with reference to FIGS. 1 to 12.

An electrical junction box 10 is arranged on a power supply path between a power supply, such as a battery of a vehicle, and loads constituted by in-vehicle electrical equipment, such as lamps and a wiper, for example, and can be used for a DC-DC converter, an inverter, or the like. In the following description, the X direction indicates a "right side", the Y direction indicates a "front side", and the Z direction indicates an "upper side".

Electrical Junction Box 10

Figure 1:
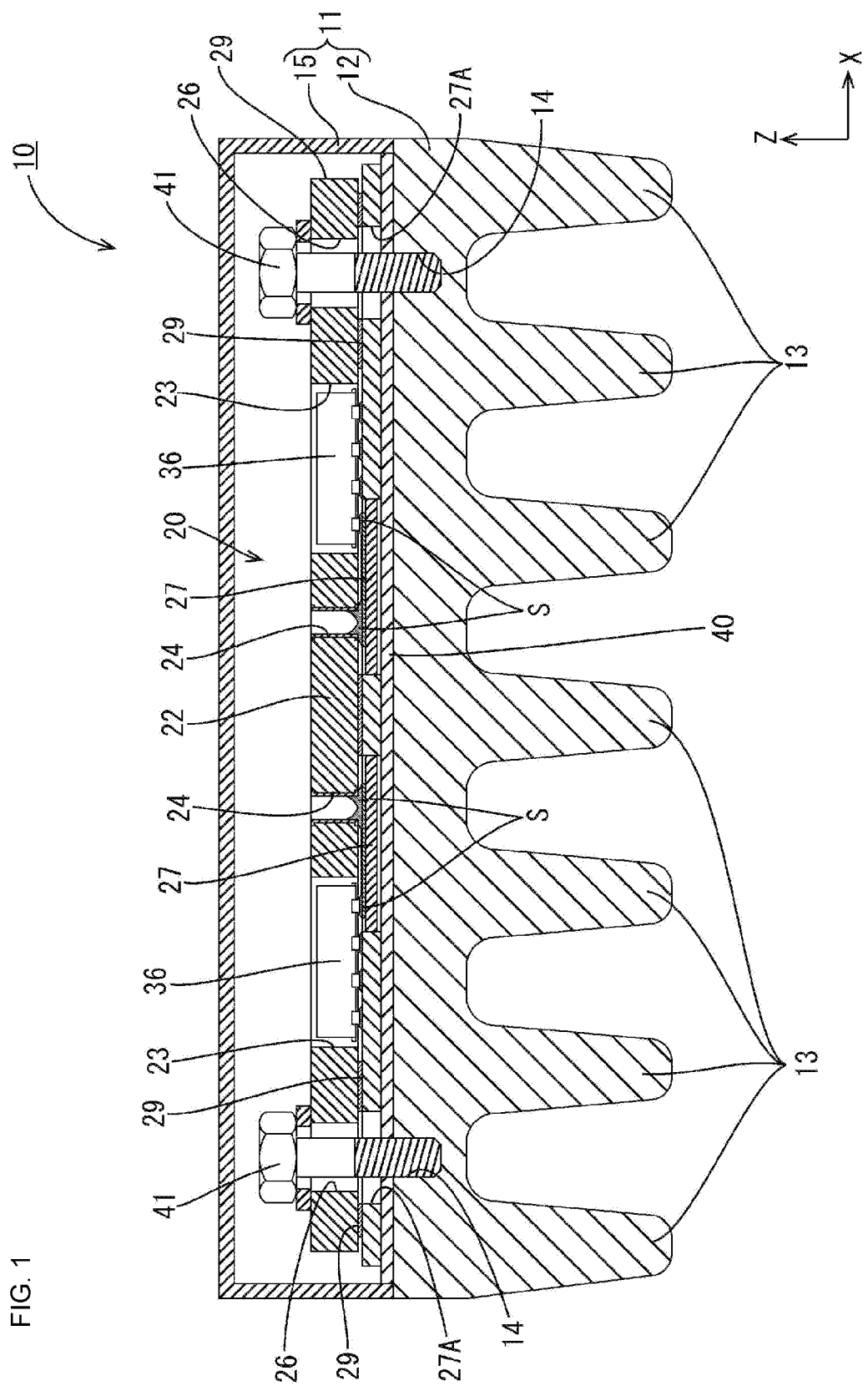
FIG. 1 is a cross-sectional view of an electrical junction box of Embodiment 1.

As shown in FIG. 1, the electrical junction box 10 includes a circuit assembly 20, and a case 11 in which the circuit assembly 20 is accommodated. The case 11 includes a heat dissipation member 12 on which the circuit assembly 20 is mounted, and a cover 15 that covers the upper side of the circuit assembly 20.

The heat dissipation member 12 is made of a metal material such as an aluminum alloy having a high thermal conductivity, and includes a flat upper surface having a size that allows a circuit board 21 to be mounted entirely thereon and a plurality of heat dissipation fins 13 lined up like comb teeth on the bottom surface. Screw holes 14 with a thread into which screws 41 can be screwed are formed in the upper surface of the heat dissipation member 12. The cover 15 is made of a synthetic resin or metal, and is formed in a box shape whose lower side is open.

Circuit Assembly 20

Figure 2:
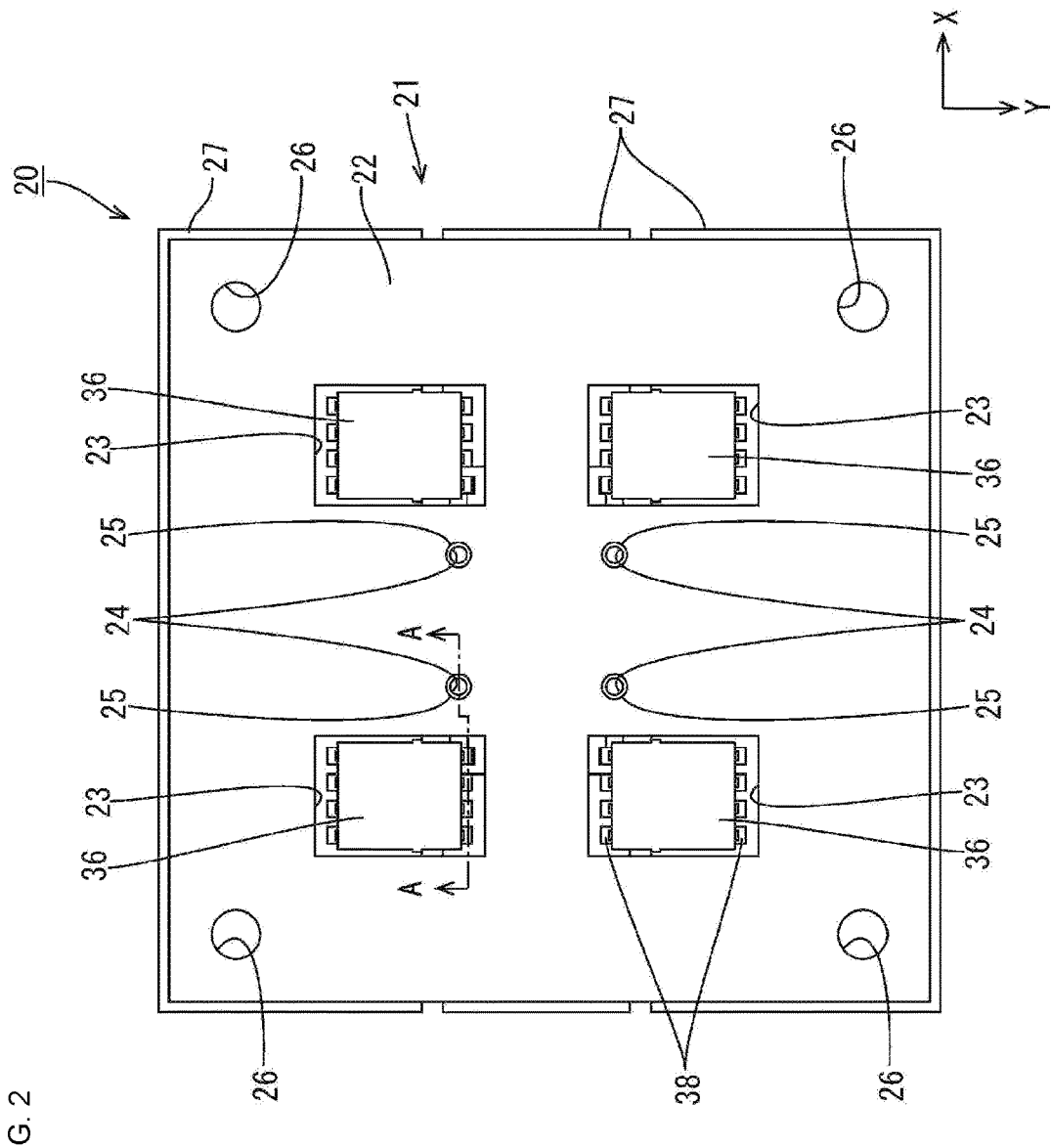
FIG. 2 is a plan view of a circuit assembly.
Figure 3:
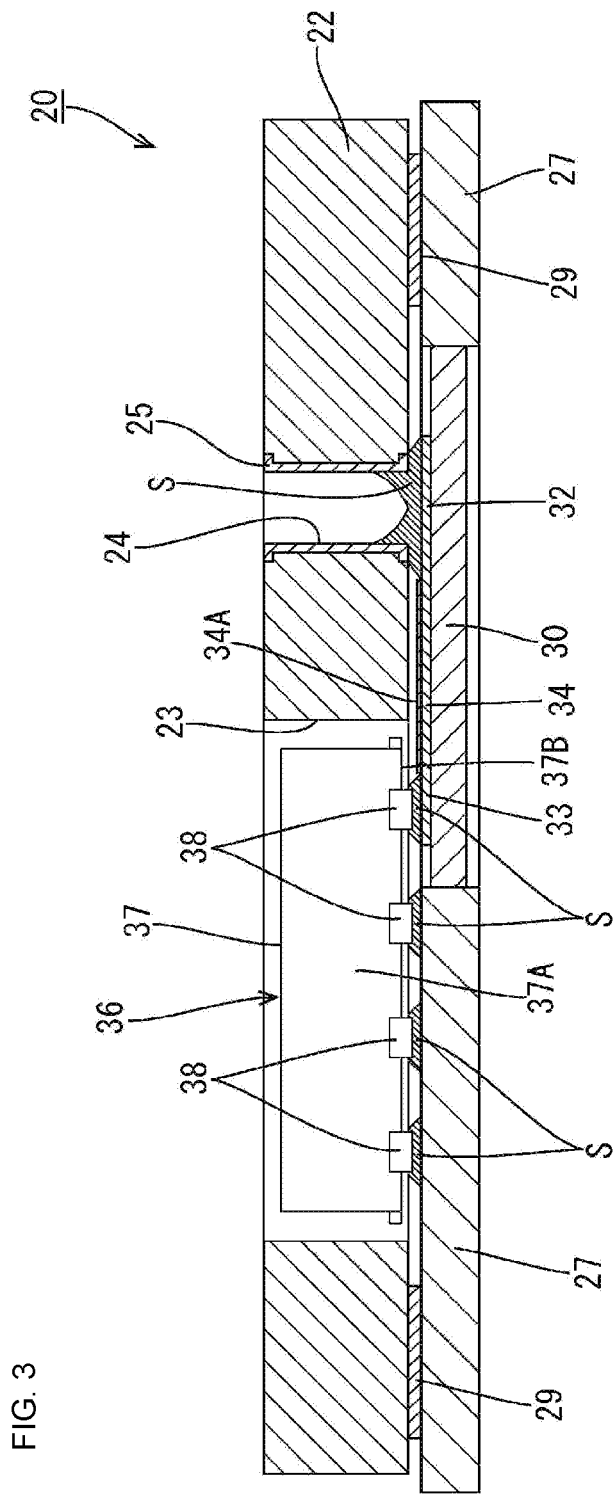
FIG. 3 is a cross-sectional view taken along line A-A in FIG. 2.
Figure 4:
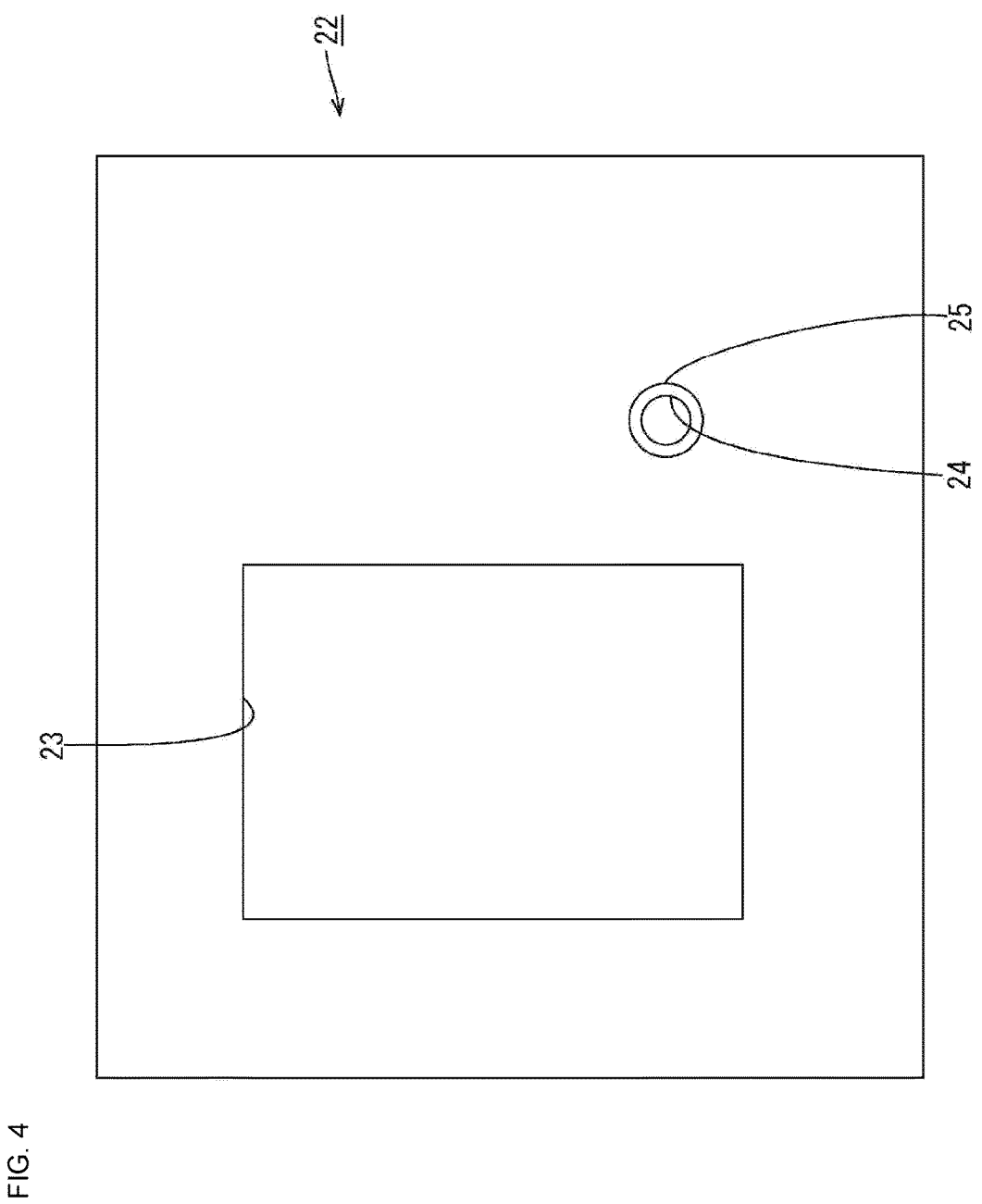
FIG. 4 is a partially enlarged plan view of a first board.
Figure 5:
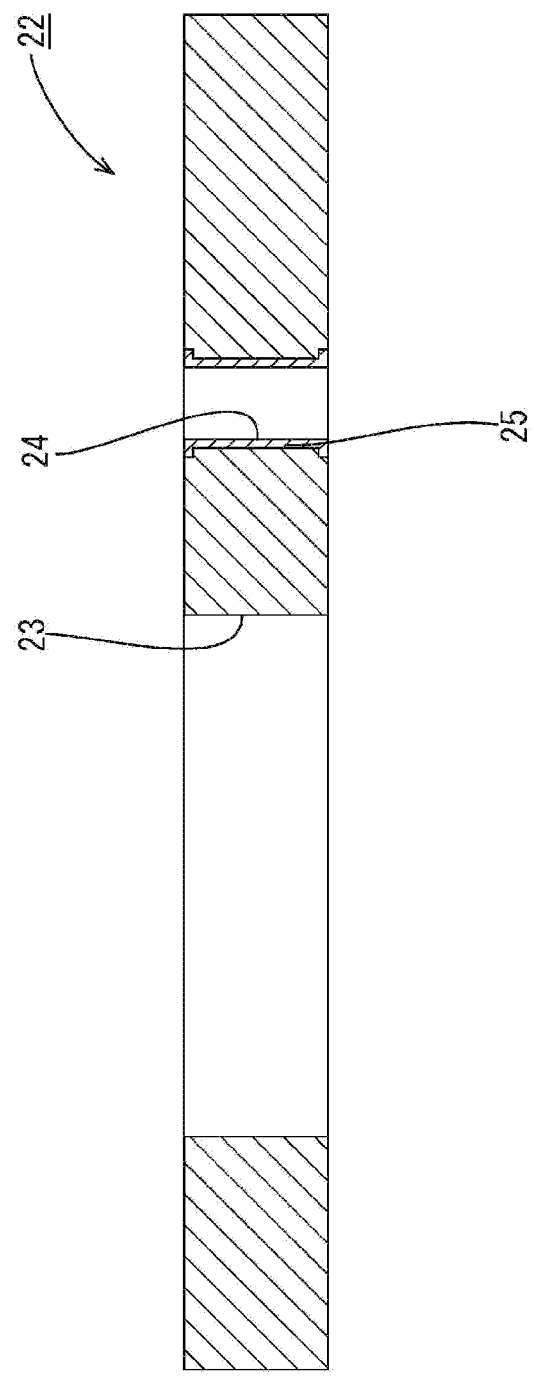
FIG. 5 is a partially enlarged cross-sectional view of the first board.

As shown in FIGS. 2 and 3, the circuit assembly 20 includes a circuit board 21, and electronic components 36 installed on the circuit board 21. The circuit board 21 includes a first board 22, a plurality of busbars 27 placed on the rear side of the first board 22, and second boards 30 that are placed on the rear side of the first board 22 and arranged on the same level as the plurality of busbars 27.

First Board 22

The first board 22 is constituted by an insulating plate made of an insulating material provided with a conductive path (not shown) made of a copper foil or the like on its upper surface through printed wiring. Insertion holes 23 into which the electronic components 36 are inserted, through holes 24, and passage holes 26 through which the shafts of the screws 41 are passed are formed through the first board 22.

The insertion holes 23 have a rectangular shape, and are formed at a plurality of (four in this embodiment) positions spaced apart from the central portion and peripheral edge portion of the first board 22. The through holes 24 are formed at a plurality of (four in this embodiment) positions that are each located inward of the insertion holes 23 and spaced apart by a predetermined distance therefrom. Each of the through holes 24 is a circular through hole, and a conductive relay portion 25 is provided on the inner wall surface and upper and lower opening edge portions of the through hole 24. The relay portion 25 is a metal member that has a tubular shape and provided on the inner wall surface and upper and lower opening edge portions of the through hole 24, and is electrically connected to the conductive path on the upper surface (front surface) of the first board 22.

Busbars 27

Figure 8:
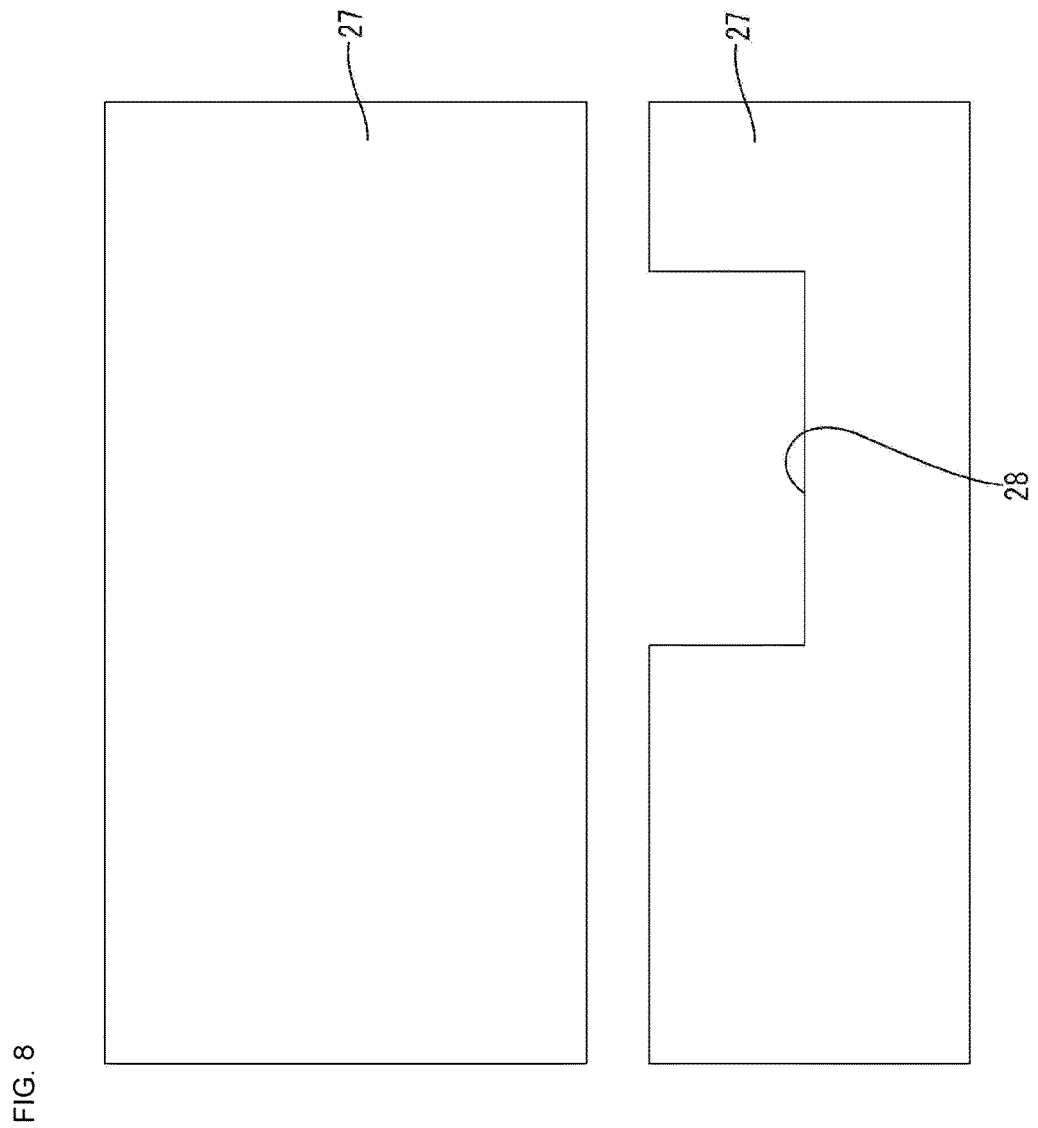
FIG. 8 is a plan view showing a plurality of busbars.
Figure 9:
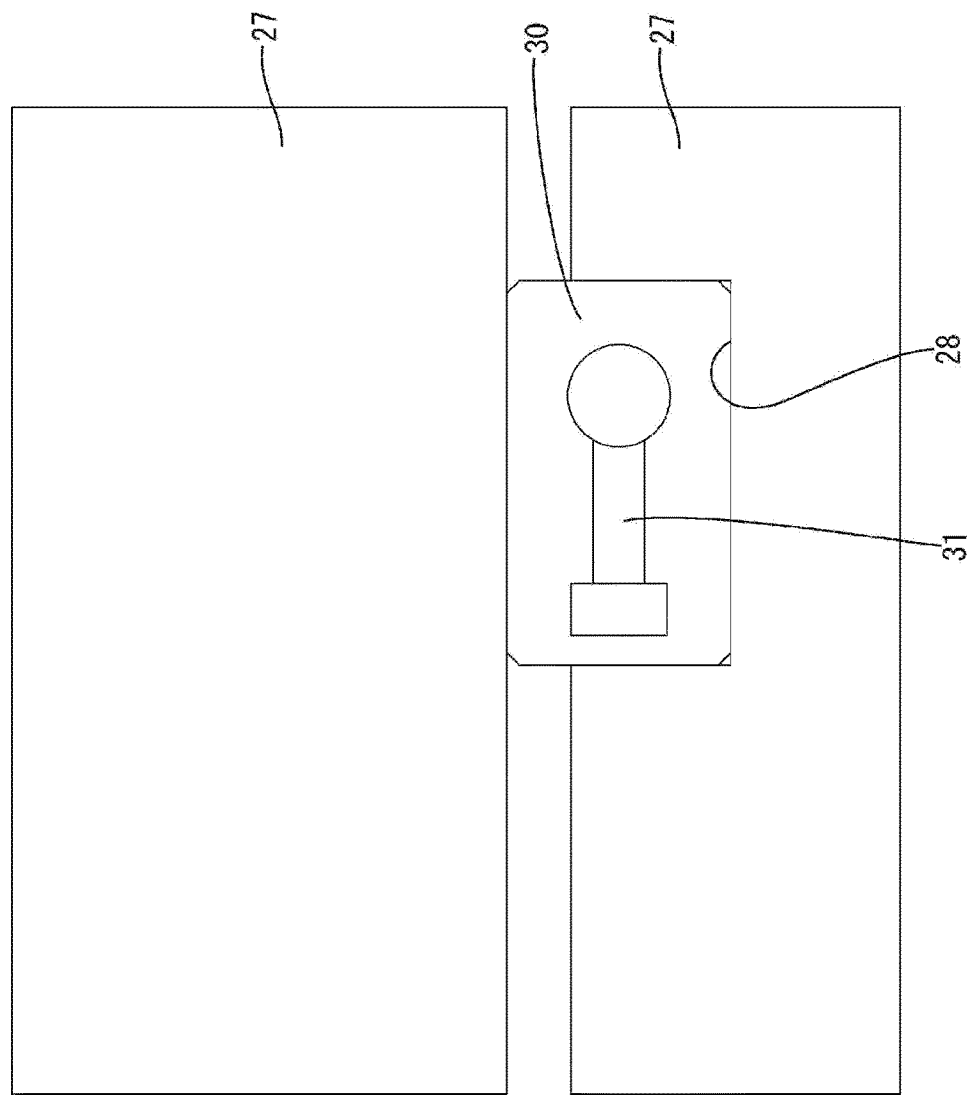
FIG. 9 is a plan view showing a state in which the second board is press-fitted into the busbar.
Figure 10:
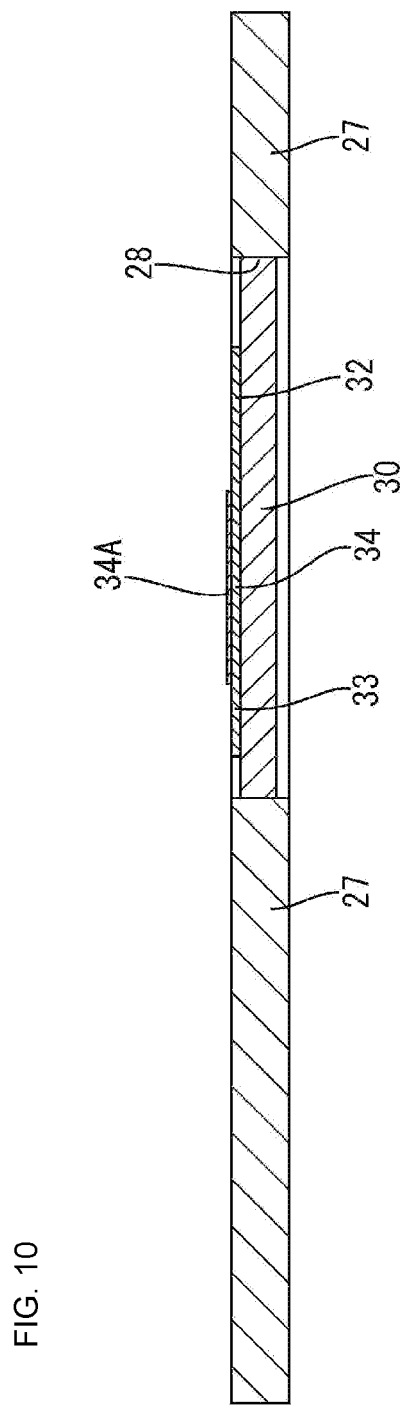
FIG. 10 is a cross-sectional view showing a state in which the second board is press-fitted into the busbar.
Figure 11:
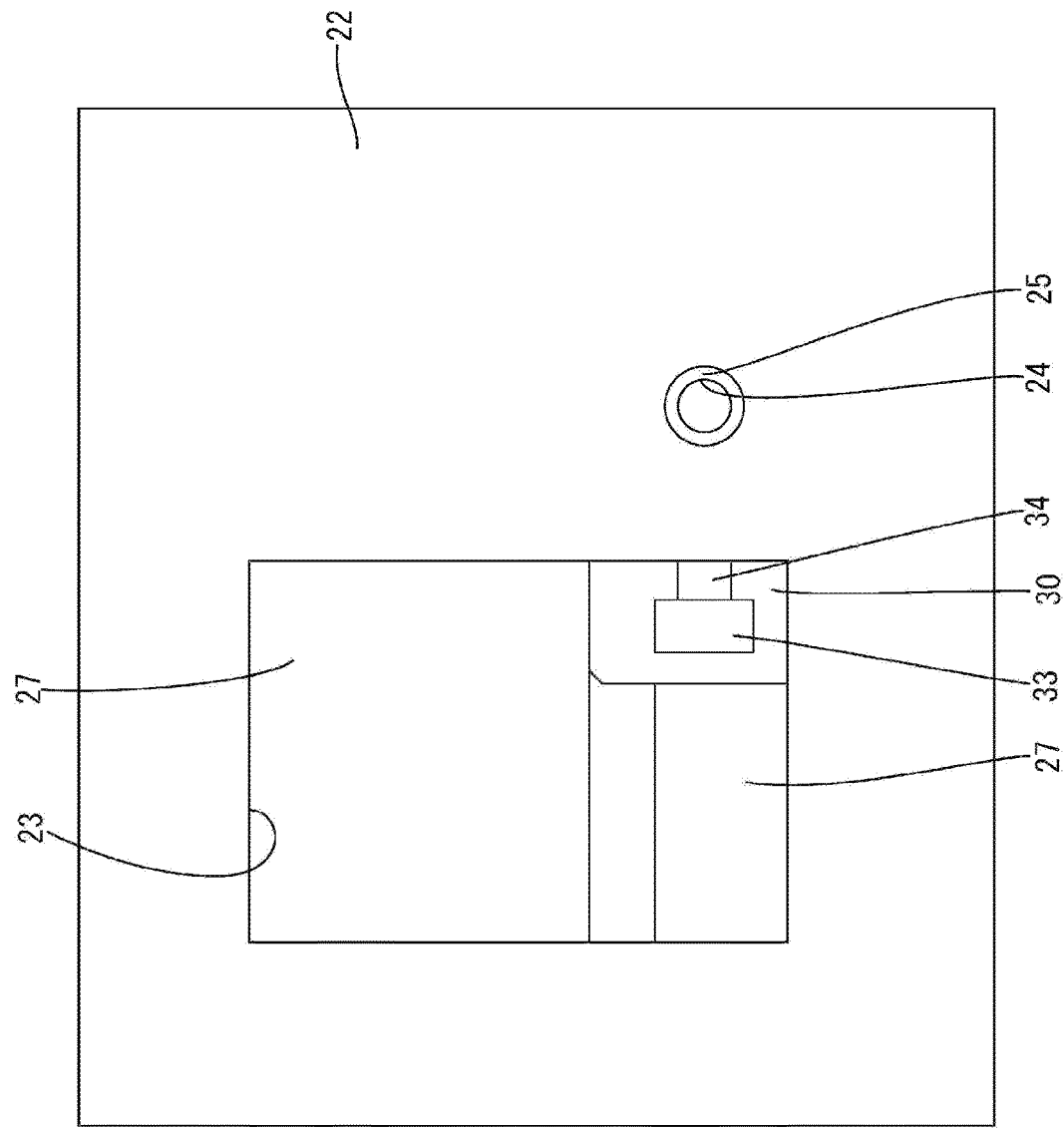
FIG. 11 is a plan view showing a state in which busbars with a second board are adhered to the first board.

The busbars 27 have a plate shape and are made of metal such as copper or a copper alloy. The busbars 27 are formed by punching metal plates into a shape corresponding to the shape of the conductive path, and are arranged with intervals on the same plane. As shown in FIG. 8, a cutout portion 28 having a shape obtained by cutting the lateral edge of the busbar 27 is formed at the lateral edge of one of the adjacent busbars 27. As shown in FIG. 9, the second board 30 is press-fitted into the cutout portion 28.

As shown in FIG. 1, the busbars 27 are adhered to the first board 22 using adhesive materials 29 (e.g., adhesive sheets or adhesives). Passage holes 27A through which the shafts of the screws 41 are to be passed are formed through the plurality of busbars 27.

Second Boards 30

Each of the second boards 30 is constituted by an insulating plate made of an insulating material provided with a conductive path (not shown) made of a copper foil or the like on its upper surface through printed wiring. The second boards 30 are thinner than the first board 22 and the busbars 27, and their sizes along the X-Y plane are smaller than that of the first board 22.

Figure 6:
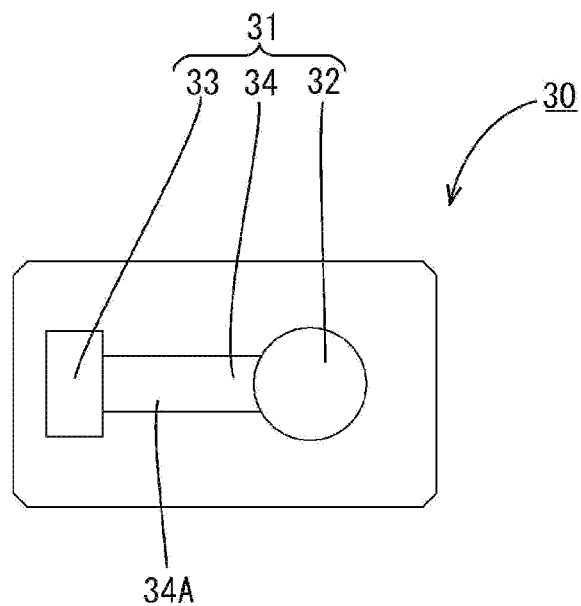
FIG. 6 is a plan view of a second board.
Figure 7:
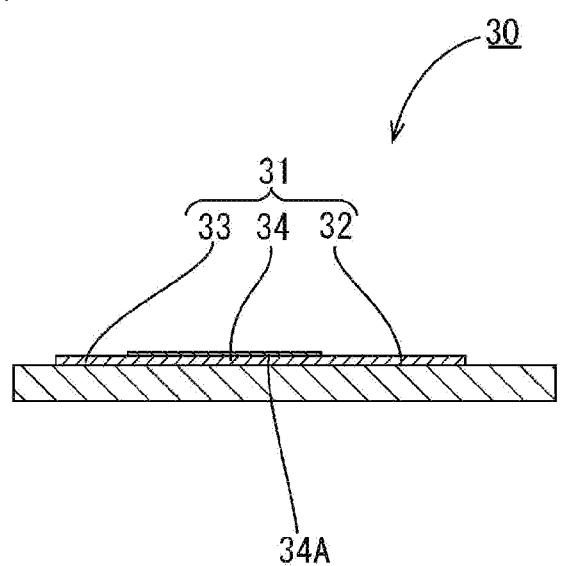
FIG. 7 is a cross-sectional view of the second board.
Figure 12:
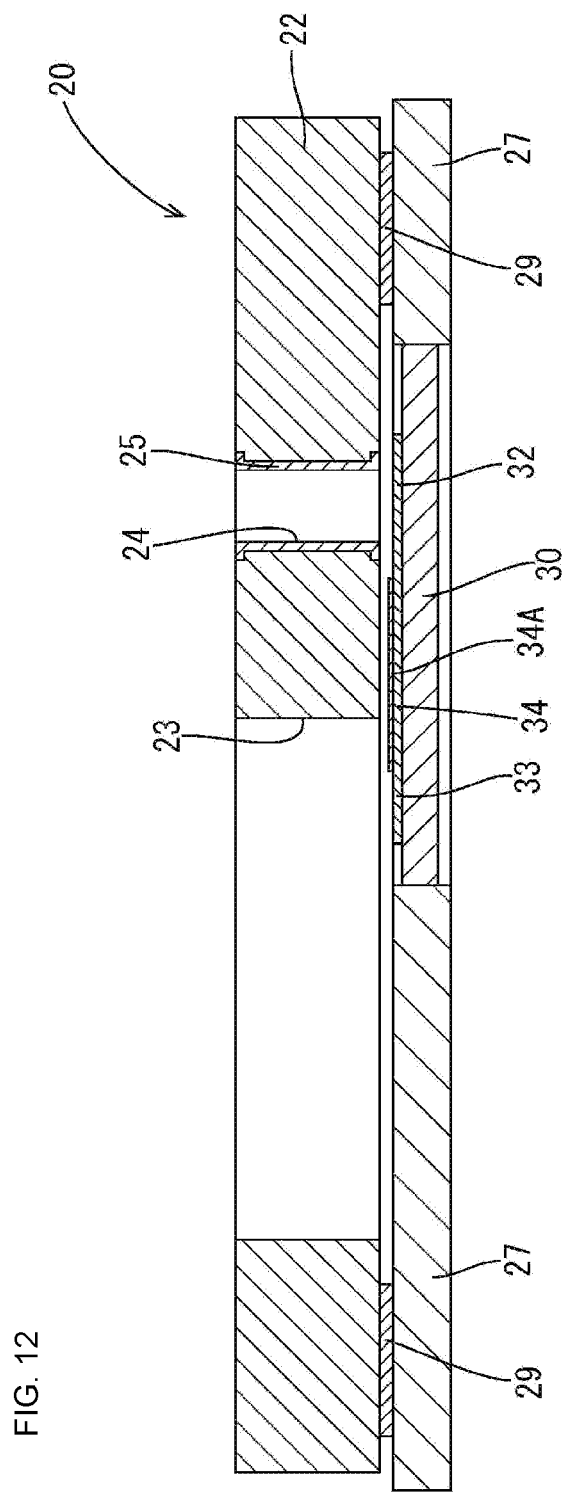
FIG. 12 is a cross-sectional view showing a state in which the busbars with a second board are adhered to the first board.

As shown in FIG. 12, in the state in which a second board 30 is press-fitted into the busbars 27 and fixed thereto, the upper surface of the second board 30 is located at a position lower than the upper surface of the busbars 27, and the lower surface of the second board 30 is located at a position higher than the lower surface of the busbars 27. As shown in FIG. 6, a conductive path 31 of each of the second boards 30 includes a relay connection portion 32, a terminal connection portion 33, and a coupling portion 34 that couples the relay connection portion 32 and the terminal connection portion 33. The relay connection portion 32 has a circular shape, and is soldered and connected to the lower end of the relay portion 25. The terminal connection portion 33 has a rectangular shape, and is soldered to a terminal 38 of the electronic component 36. A sheet 34A constituted by belt-shaped metal is layered on the coupling portion 34. The edges of the sheet 34A in the longitudinal direction can stop the spread of solder S connected to the relay connection portion 32 and the terminal connection portion 33.

In this embodiment, a so-called leadless component, which includes short terminals 38, is used as the electronic component 36. As shown in FIG. 3, the electronic component 36 is constituted by a FET (field effect transistor) or the like, and includes a main body 37 and a plurality of terminals 38. The main body 37 has a rectangular parallelepiped shape, and is sheathed by a sheathing body 37A made of a synthetic resin. The terminals 38 exposed from the bottom side of the sheathing body 37A are arranged along a bottom surface 37B of the sheathing body 37A. At least one of the plurality of terminals 38 of each electronic component 36 is soldered to the busbar 27 with solder S, and at least one of the other terminals 38 is soldered to the terminal connection portion 33 with solder S. An insulating layer 40 constituted by a cured insulating adhesive is formed between the bottom surface of the circuit assembly 20 and the upper surface of the heat dissipation member 12. For example, a heat-curing epoxy resin-based adhesive can be used as the insulating layer 40.

A method for manufacturing the electrical junction box 10 will be described.

As shown in FIG. 9, a busbar 27 with a second circuit board is formed by press-fitting the second board 30 into the cutout portion 28 of the busbar 27, and the busbar 27 adjacent to the busbar 27 with a second circuit board is arranged to come into intimate contact with the second board 30. Next, an adhesive is applied to the first board 22 or the busbars 27, and then the first board 22 and the busbars 27 are adhered (FIG. 12).

Solder paste is applied to predetermined positions of the busbars 27, and the relay connection portions 32 and terminal connection portions 33 of the second boards 30, and then the plurality of terminals 38 of the electronic components 36 are soldered to the busbars 27 and the terminal connection portions 33 with the solder S, and the relay portions 25 are soldered to the relay connection portions 32 with the solder S, by reflow soldering with a reflow furnace. The circuit assembly 20 is thus formed (FIG. 3). Next, the circuit assembly 20 is mounted on the heat dissipation member 12 via an insulating layer 40. The shafts of the screws 41 are passed through washers 42, the passage holes 26 of the first board 22, and the passage holes 27A of the busbars 27, and the screws 41 are screwed into the screw holes 14. The circuit assembly 20 is thus fixed to the heat dissipation member 12. Then, the cover 15 is put over the circuit assembly 20, and the electrical junction box 10 is thus formed (FIG. 1).

With the above-mentioned embodiment, the following functions and effects are attained.

In the circuit assembly 20, the second boards 30 overlap with the first board 22, and at least portions of the second boards 30 are arranged on the same level as the busbars 27, thus making it less likely that level differences are formed between the busbars 27 and the conductive paths 31 of the second boards 30 to which the plurality of terminals 38 of the electronic components 36 inserted into the insertion holes 23 of the first board 22 are connected. Therefore, level differences formed between the conductive paths of the second boards 30 and the busbars 27 to which the terminals 38 of the electronic components 36 are connected can be suppressed.

The cutout portions 28 into which the second boards 30 are press-fitted are formed in the busbars 27.

With this configuration, the second boards 30 can be positioned with respect to the busbars 27, and the second boards 30 can be easily placed overlapping the first board 22.

The conductive path of the first board 22 is electrically connected to the relay portions 25 passing through the first board 22, and the relay portions 25 are connected to the conductive paths of the second boards 30 with the solder S.

With this configuration, the terminals 38 of the electronic components 36 can be electrically connected to the conductive path of the first board 22 via the conductive paths 31 of the second boards 30 and the relay portions 25.

Each of the electronic components 36 is sheathed by the sheathing body 37A made of a resin, and the terminals 38 are exposed through the sheathing body 37A and lined up along the bottom surface 37B of the sheathing body 37A.

With this configuration, the size of the electronic component 36 can be reduced, and therefore, the size of the circuit assembly 20 can be reduced.

The insertion holes 23 are through holes, and the electronic components 36 are accommodated entirely in the insertion holes 23.

With this configuration, it is possible to prevent the electronic components 36 from protruding from the surface of the first board 22, thus making it possible to reduce the size of the circuit assembly 20.

Embodiment 2

Next, Embodiment 2 will be described with reference to FIGS. 13 to 21. Structural aspects identical to those of Embodiment 1 are denoted by identical reference numerals, and their further descriptions are omitted.

Figure 13:
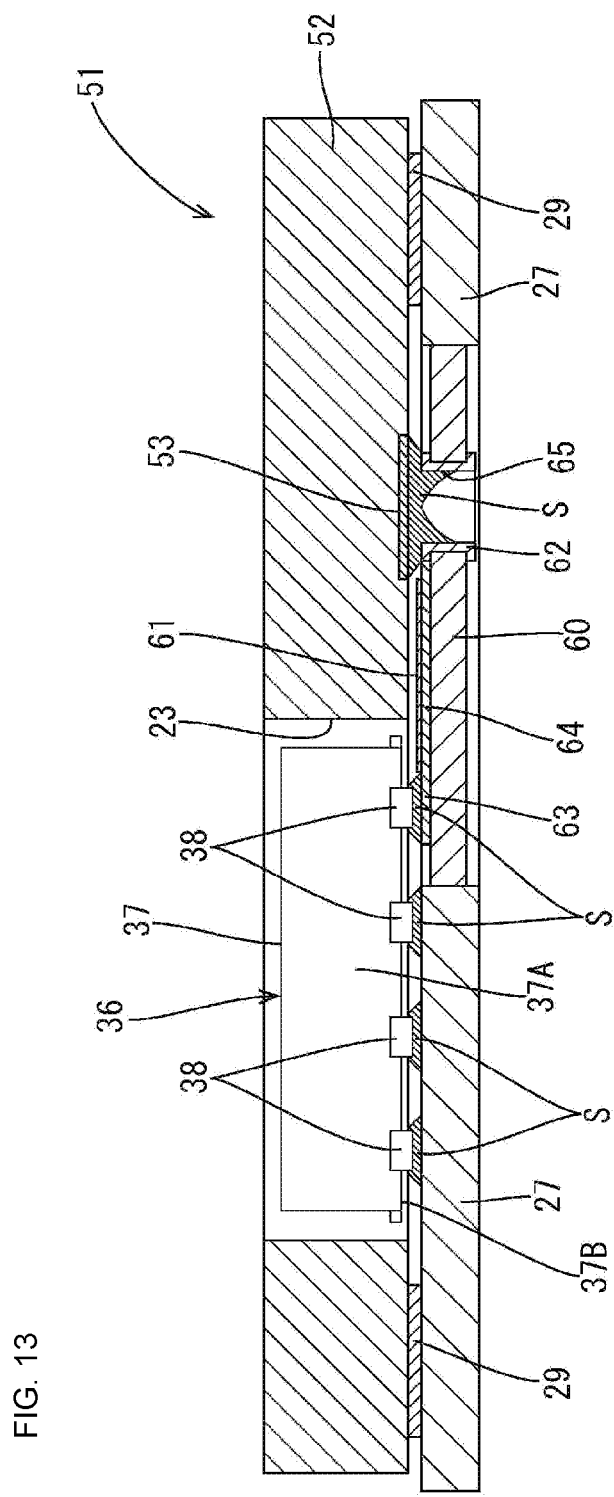
FIG. 13 is a cross-sectional view of a circuit assembly of Embodiment 2.
Figure 14:
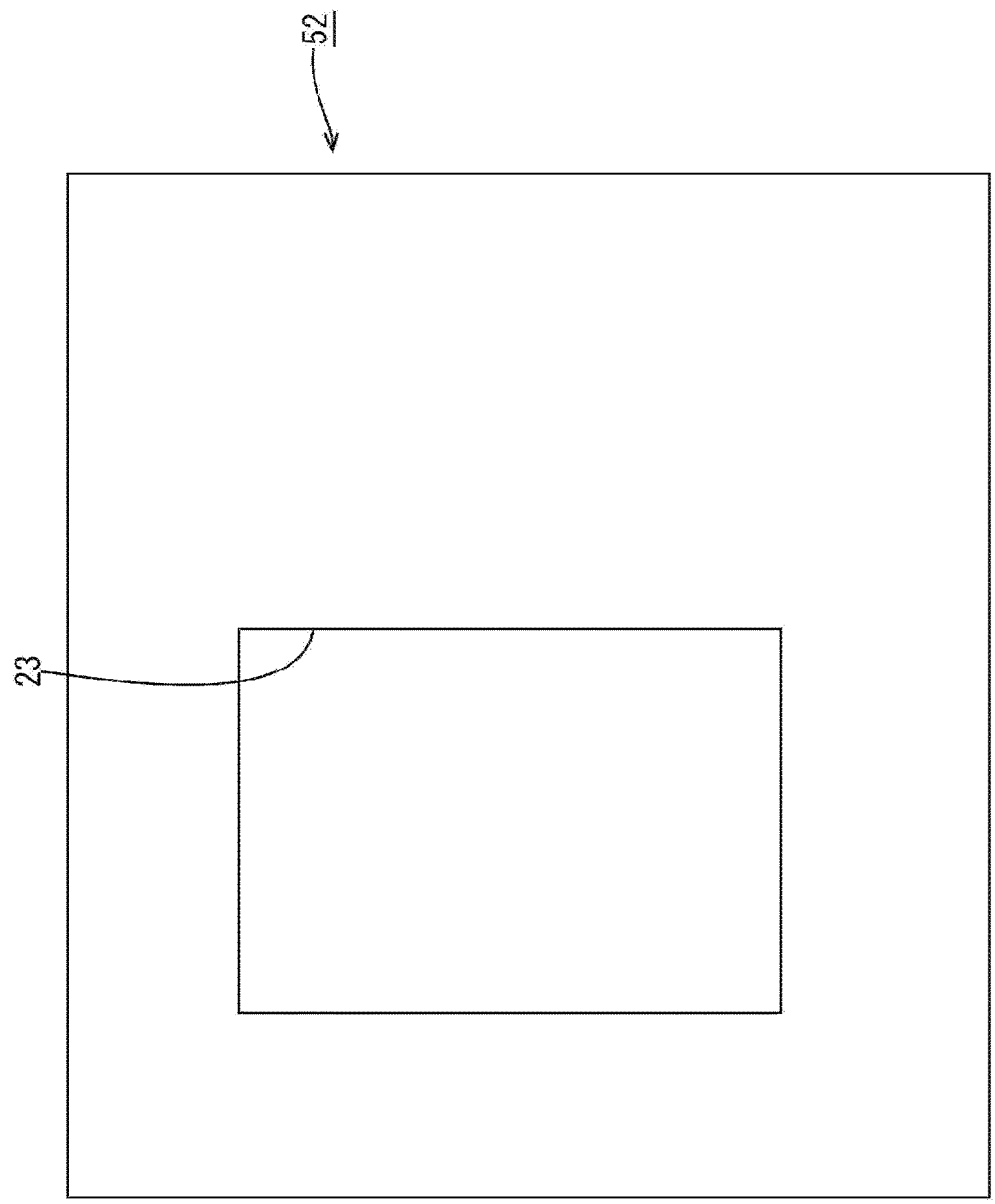
FIG. 14 is a partially enlarged plan view of a first board.
Figure 15:
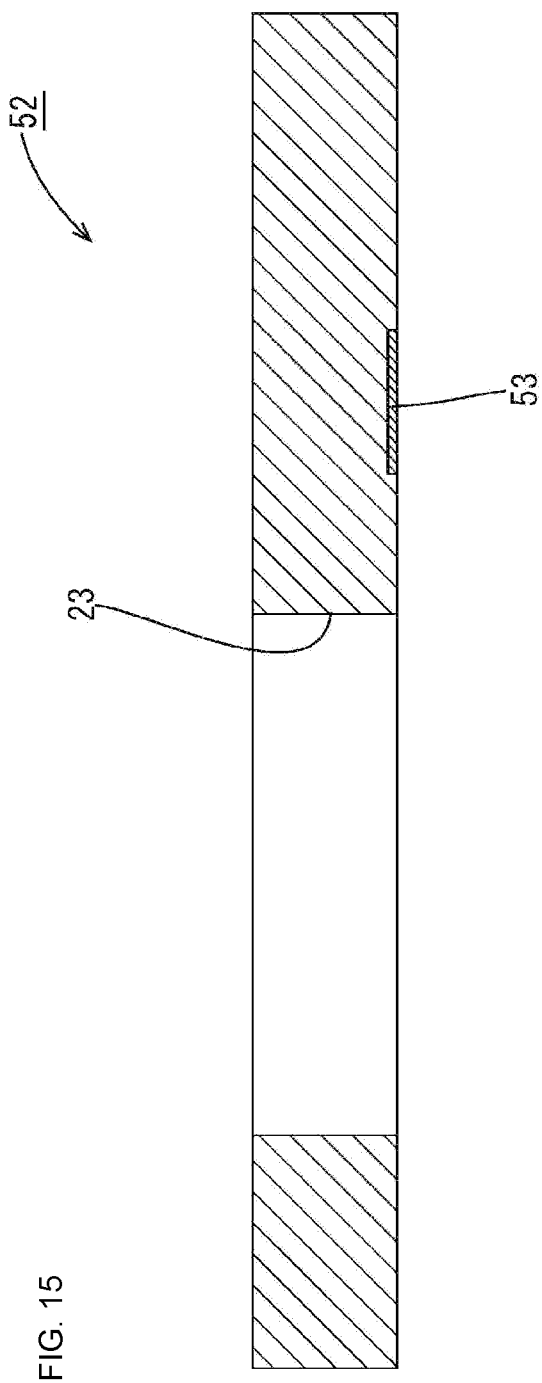
FIG. 15 is a partially enlarged cross-sectional view of the first board.

As shown in FIG. 13, a circuit assembly 50 includes a circuit board 51, and electronic components 36 installed on the circuit board 51. The circuit board 51 includes a first board 52, a plurality of busbars 27 placed on the rear side of the first board 52, and second boards 60 that are placed on the rear side of the first board 52 and arranged on the same level as the plurality of busbars 27. The first board 52 is constituted by an insulating plate made of an insulating material provided with conductive paths (not shown) made of a copper foil or the like on its upper surface and lower surface through printed wiring. Connection portions 53 that are portions of the conductive path are formed on the lower surface of the first board 52.

Figure 16:
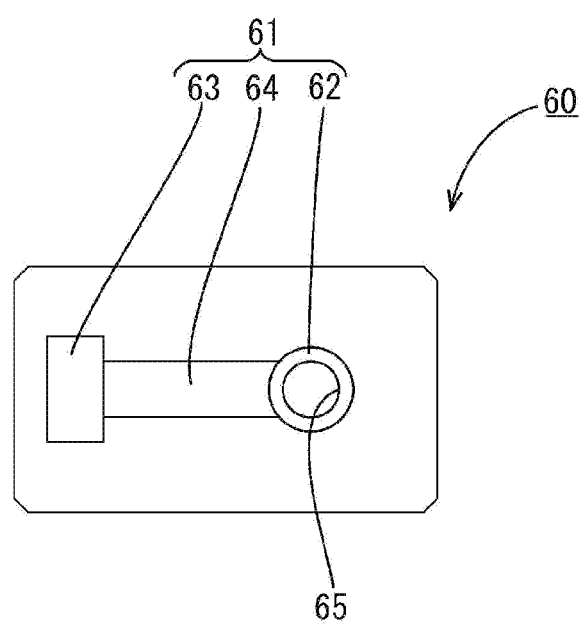
FIG. 16 is a plan view of a second board.
Figure 17:
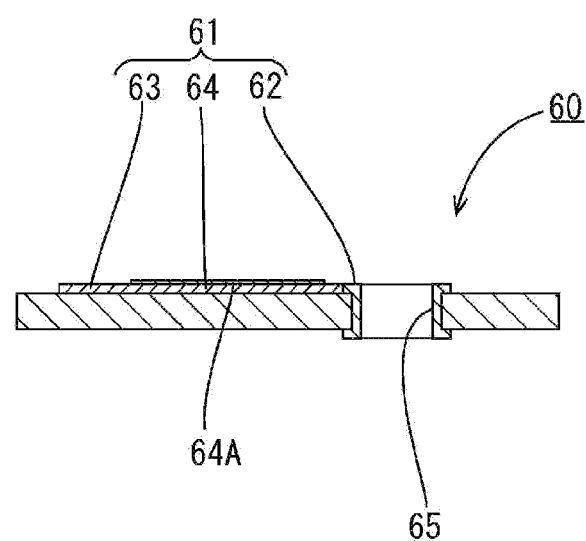
FIG. 17 is a cross-sectional view of the second board.

The second boards 60 are constituted by an insulating plate made of an insulating material provided with a conductive path 61 made of a copper foil or the like on its upper surface through printed wiring, and through holes 65 are formed through the second boards 60. As shown in FIGS. 16 and 17, the conductive paths 61 of the second boards 60 include a relay connection portion 62, a terminal connection portion 63 to be soldered to the terminals 38, and a coupling portion 64 that couples the relay connection portion 62 to be soldered to the connection portion 53 and the terminal connection portion 63. The relay connection portion 62 made of metal such as a copper foil is provided on the opening edges and inner wall surface of the through hole 65. The relay connection portion 62 has a tubular shape, and is arranged at a position overlapping the connection portion 53 (a region of the connection portion 53) as shown in FIG. 13. The connection portion 53 is soldered and electrically connected to the relay connection portion 62. The solder S inside the relay connection portion 62 can be visually confirmed from the lower surface side of the circuit assembly 50. It should be noted that a configuration in which relay connection portions connected to the conductive path on the upper surface of the first board 52 are provided through the first board 52, and the connection portions 53 are connected to the relay connection portions is also possible.

A method for manufacturing the circuit assembly 50 will be described next.

Figure 18:
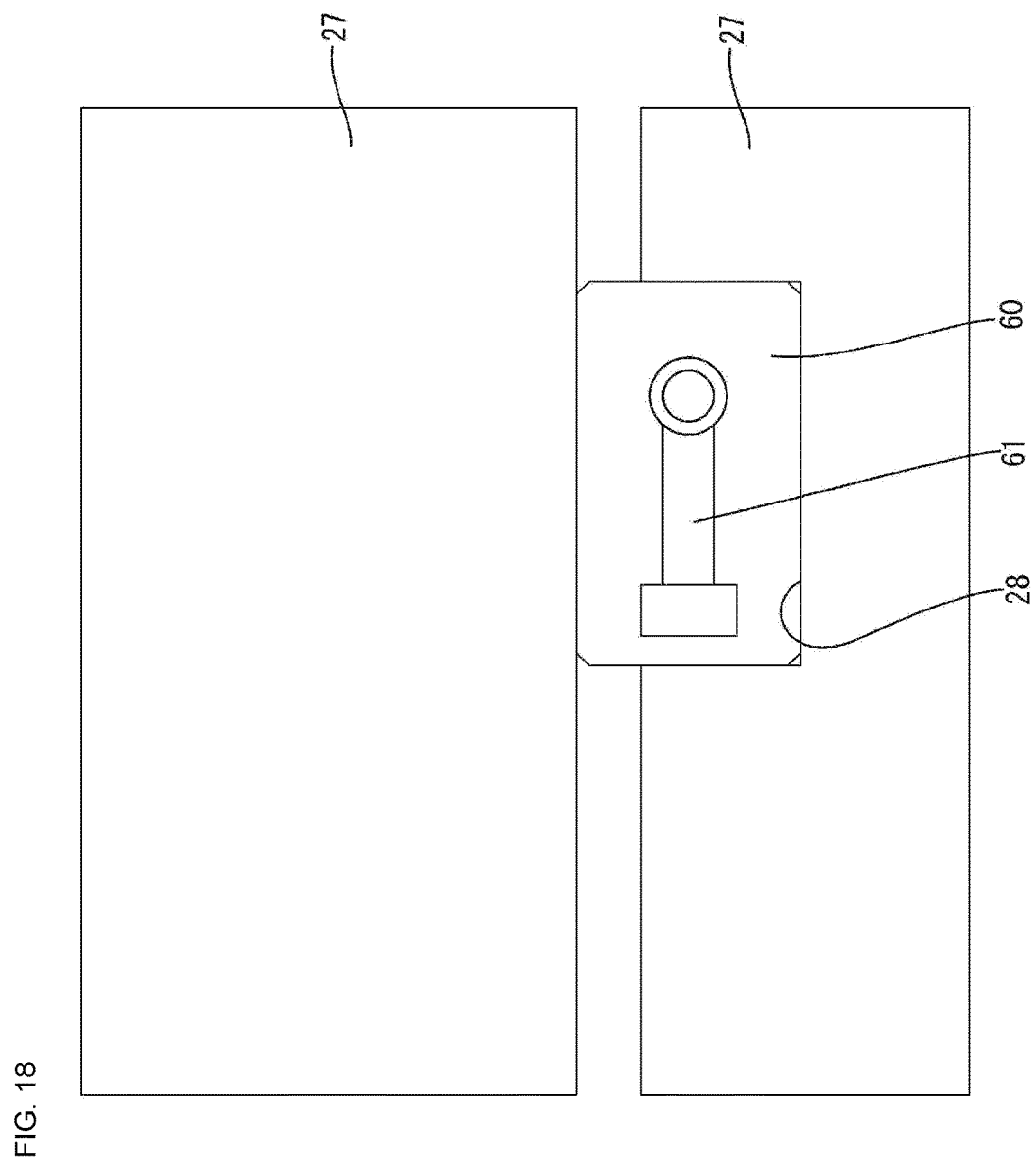
FIG. 18 is a plan view showing a state in which the second board is press-fitted into a busbar.
Figure 19:
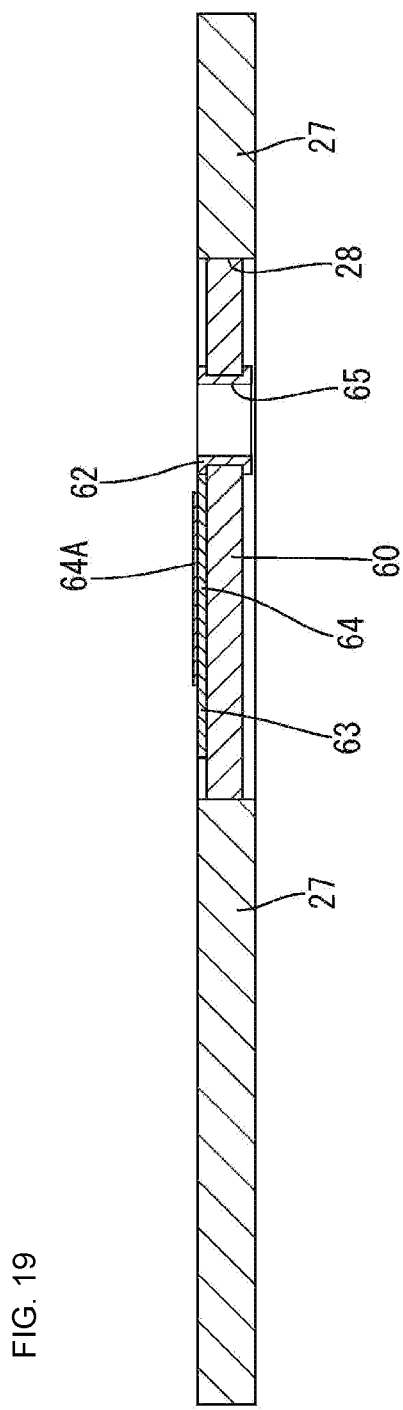
FIG. 19 is a cross-sectional view showing a state in which the second board is press-fitted into the busbar.
Figure 20:
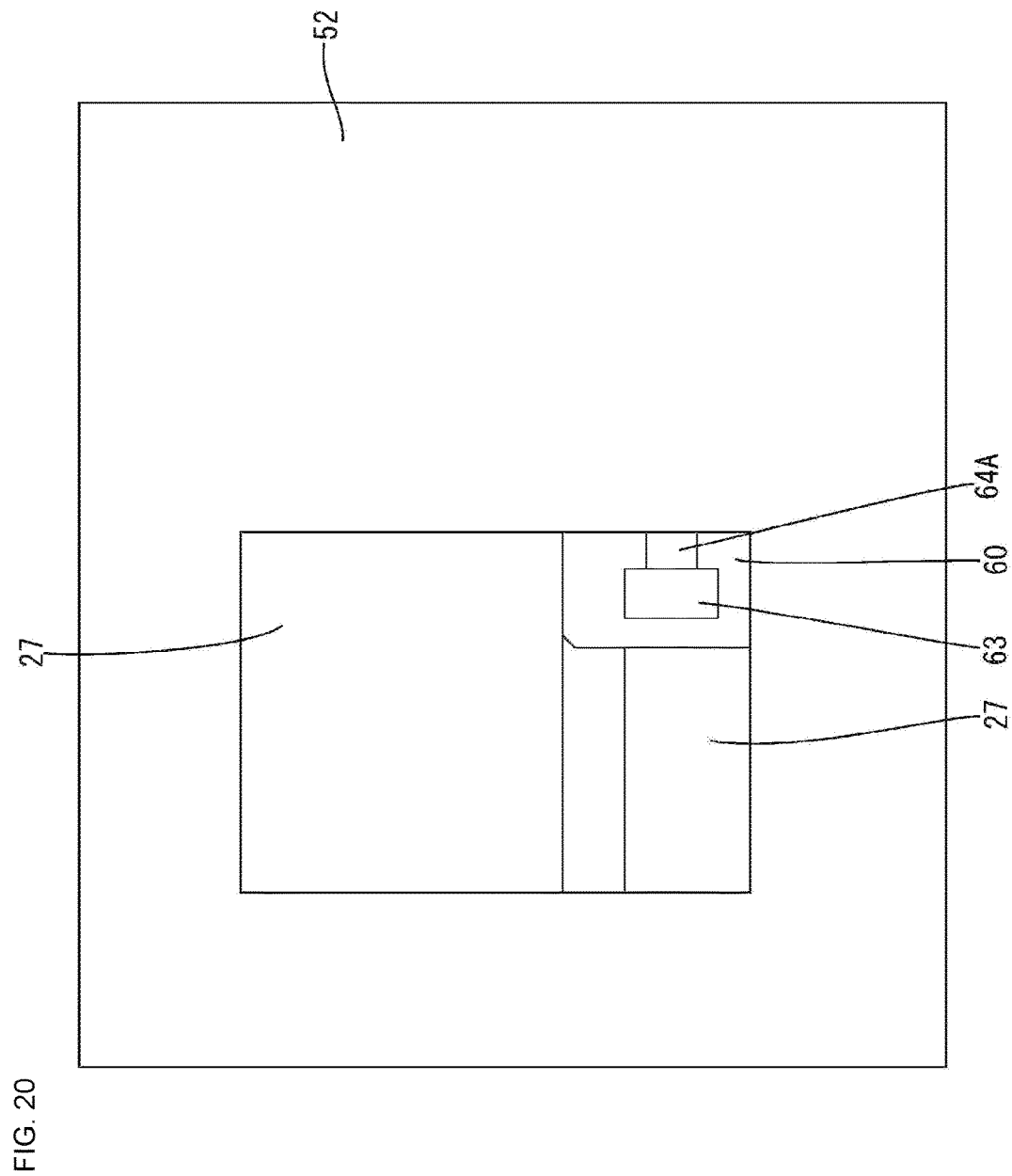
FIG. 20 is a plan view showing a state in which busbars with a second board are adhered to the first board.
Figure 21:
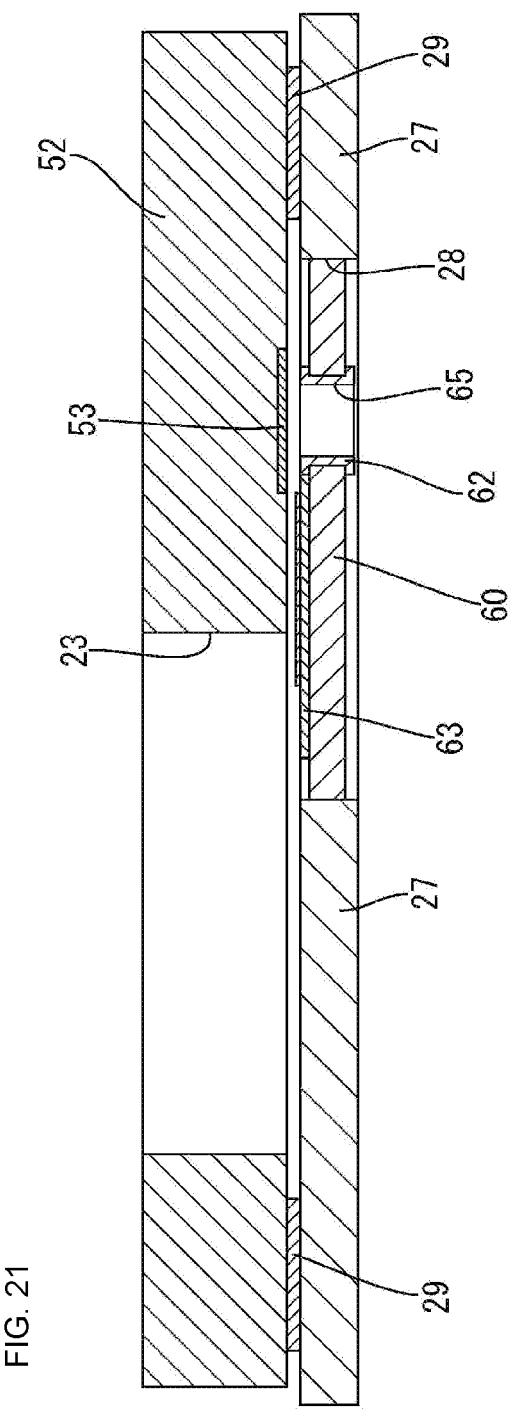
FIG. 21 is a cross-sectional view showing a state in which the busbars with a second board is adhered to the first board.

As shown in FIGS. 18 and 19, the second board 60 is press-fitted into the cutout portion 28 of the busbar 27, and then another busbar 27 is arranged at a predetermined position. Then, an adhesive is applied to the first board 52 or the busbars 27, and the first board 52 and the busbars 27 are adhered (FIGS. 20 and 21). Next, solder paste is applied to predetermined positions of the busbars 27, the terminal connection portions 63 of the second boards 60, and the connection portions 53 of the first board 52 or the relay connection portions 62, and then the plurality of terminals 38 are soldered to the busbars 27 and the terminal connection portions 63, and the connection portions 53 are soldered to the relay connection portions 62, by reflow soldering with a reflow furnace. The circuit assembly 50 is thus formed (FIG. 13).

Other Embodiments

The present invention is not limited to the embodiments that have been described above with reference to the drawings, and embodiments such as those described below are also included in the technical scope of the present invention.

The electronic components 36 are not limited to FETs, and various electronic components can be used. For example, mechanical relays, coils, capacitors, or the like may also be used.

Although the insertion holes 23 are through holes, there is no limitation to this configuration. For example, a configuration is also possible in which the insertion holes 23 are formed as recessed portions that are closed on the upper surface side (side opposite to the busbars 27), and the electronic components 36 are accommodated in the recessed portions.

Although the second boards 30 and 60 are arranged entirely within the layer (thickness) of the busbar 27, there is no limitation to this configuration. For example, a portion (at least a portion) of the thickness of the second board 30 or 60 may be placed overlapping the layer (thickness) of the busbar 27. Moreover, although each of the second boards 30 and 60 has a thickness smaller than those of the busbars 27, there is no limitation to this configuration. Each of the second boards 30 and 60 may have the same thickness as the busbars 27 or a thickness larger than the busbars 27.

Although the cutout portions 28 into which the second boards 30 are to be press-fitted are provided in the busbars 27, there is no limitation to this configuration. For example, a configuration is also possible in which each of the second boards 30 and 60 is press-fitted into or held between the adjacent busbars 27 provided with no cutout portions 28. Moreover, through holes into which the second boards 30 and 60 are press-fitted or inserted may also be formed through the busbars 27, for example.

Although each of the second boards 30 and 60 are press-fitted into the busbars 27, there is no limitation to this configuration. For example, a gap may be formed between the busbar 27 and the second board 30 or 60. Moreover, another member (e.g. a spacer) may also be provided between the busbar 27 and the second board 30 or 60, for example.

The invention claimed is:

1. A circuit assembly comprising:
   an electronic component including a plurality of terminals;
   a first board that is constituted by an insulating plate provided with a conductive path and an insertion hole into which the electronic component is inserted;
   a busbar that overlaps the first board; and
   a second board that is constituted by an insulating plate provided with a conductive path and overlapping the first board, at least a portion of the second board being arranged on the same level as the busbar,
   wherein the plurality of terminals of the electronic component are connected to the busbar and the conductive path of the second board.

2. The circuit assembly according to claim 1, wherein the busbar has a cutout portion into which the second board is press-fitted.

3. The circuit assembly according to claim 1, wherein the conductive path of the first board is electrically connected to a relay portion passing through the first board, and the relay portion is connected to the conductive path of the second board with solder.

4. The circuit assembly claim 1,
   wherein the electronic component is sheathed by a sheathing body made of a resin, and
   the terminals are exposed through the sheathing body and lined up along a bottom surface of the sheathing body.

5. The circuit assembly according to claim 1, wherein the insertion hole is a through hole, and the electronic component is accommodated entirely in the insertion hole.

6. An electrical junction box comprising:
   the circuit assembly according to claim 1; and
   a case in which the circuit assembly is accommodated.

7. The circuit assembly according to claim 2, wherein the conductive path of the first board is electrically connected to a relay portion passing through the first board, and the relay portion is connected to the conductive path of the second board with solder.

8. The circuit assembly according to claim 2, wherein the electronic component is sheathed by a sheathing body made of a resin, and
   the terminals are exposed through the sheathing body and lined up along a bottom surface of the sheathing body.

9. The circuit assembly according to claim 3, wherein the electronic component is sheathed by a sheathing body made of a resin, and
   the terminals are exposed through the sheathing body and lined up along a bottom surface of the sheathing body.

10. The circuit assembly according to claim 2, wherein the insertion hole is a through hole, and the electronic component is accommodated entirely in the insertion hole.

11. The circuit assembly according to claim 3, wherein the insertion hole is a through hole, and the electronic component is accommodated entirely in the insertion hole.

12. The circuit assembly according to claim 4, wherein the insertion hole is a through hole, and the electronic component is accommodated entirely in the insertion hole.

13. An electrical junction box comprising:
    the circuit assembly according to claim 2; and
    a case in which the circuit assembly is accommodated.

14. An electrical junction box comprising:
    the circuit assembly according to claim 3; and
    a case in which the circuit assembly is accommodated.

15. An electrical junction box comprising:
    the circuit assembly according to claim 4; and
    a case in which the circuit assembly is accommodated.

16. An electrical junction box comprising:
    the circuit assembly according to claim 5; and
    a case in which the circuit assembly is accommodated.

* * * * *